US007021517B2

(12) United States Patent
Zakel et al.

(10) Patent No.: US 7,021,517 B2
(45) Date of Patent: Apr. 4, 2006

(54) METHOD AND DEVICE FOR APPLYING PIECES OF MATERIAL TO A WORKPIECE

(75) Inventors: Elke Zakel, Falkensee (DE); Paul Kasulke, Berlin (DE); Oliver Uebel, Berlin (DE); Lars Titerle, Berlin (DE)

(73) Assignee: Pac Tec - Packaging Technologies GmbH, Nauen (DE)

( * ) Notice: Subject to any disclaimer, the term of this patent is extended or adjusted under 35 U.S.C. 154(b) by 0 days.

(21) Appl. No.: 10/398,787

(22) PCT Filed: Oct. 2, 2001

(86) PCT No.: PCT/EP01/11421

§ 371 (c)(1),
(2), (4) Date: Jun. 19, 2003

(87) PCT Pub. No.: WO02/28589

PCT Pub. Date: Apr. 11, 2002

(65) Prior Publication Data

US 2004/0011852 A1 Jan. 22, 2004

(30) Foreign Application Priority Data

Oct. 6, 2000 (DE) ................................ 100 49 583

(51) Int. Cl.
*B23K 3/00* (2006.01)

(52) U.S. Cl. ........................... 228/41; 228/43; 221/263

(58) Field of Classification Search ................ 228/245, 228/246, 41, 43, 33, 51, 52, 4.5, 180.5; 221/263–265, 221/278, 236, 158, 159
See application file for complete search history.

(56) References Cited

U.S. PATENT DOCUMENTS

| | | | | |
|---|---|---|---|---|
| 5,653,381 | A * | 8/1997 | Azdasht | 228/254 |
| 6,003,753 | A * | 12/1999 | Hwang et al. | 228/41 |
| 6,119,919 | A * | 9/2000 | Kasulke | 228/119 |
| 6,152,348 | A * | 11/2000 | Finn et al. | 228/41 |
| 6,336,581 | B1 * | 1/2002 | Tuchiya et al. | 228/33 |
| 6,427,903 | B1 * | 8/2002 | Foulke et al. | 228/246 |
| 6,634,545 | B1 * | 10/2003 | Razon et al. | 228/246 |

FOREIGN PATENT DOCUMENTS

| | | | |
|---|---|---|---|
| DE | 195 41 996 A1 | | 5/1997 |
| JP | 59064162 | * | 12/1984 |

OTHER PUBLICATIONS

Patent Abstracts of Japan, No. JP 59064162, Published Apr. 12, 1984, N. Yoshihro.

(Continued)

*Primary Examiner*—Jonathan Johnson
(74) *Attorney, Agent, or Firm*—Dougherty Clements

(57) ABSTRACT

The invention relates to a device for applying pieces of material to a workpiece. Said device comprises a plurality of capillaries which respectively bring a piece of material (6) to a work station (3) in one working cycle. The piece of material is placed on the work station. A filling station fills a circular conveyer with a number of pieces of material (6) corresponding to the number of capillaries (4). An extracting station (19) is arranged in the transport path from the filling station (18) to the machining station (4'), said extracting station (19) extracting individual fragments of material (6) in a selective manner.

19 Claims, 2 Drawing Sheets

OTHER PUBLICATIONS

Patent Abstracts of Japan, No. JP 2000294681, Published Oct. 20, 2000, H. Keiichi.

Patent Abstracts of Japan, No. JP 08070174, Published Mar. 12, 1996, S. Seiji.

Patent Abstracts of Japan, No. JP 07202400, Published Aug. 04, 1995, K. Tomoya.

* cited by examiner

METHOD AND DEVICE FOR APPLYING PIECES OF MATERIAL TO A WORKPIECE

The invention relates to a method and a device for applying pieces of material to a workpiece.

For the purposes of the invention, pieces of material can be pieces of any material in solid or liquid form. It can be a solderable material such as gold, copper, tin, glass or a plastic which are, in particular, micro-size pieces of material in the form of solder pellets, glass globules or plastic globules. It can also be pieces of ceramic or components such as miniature circuits, surface mounted devices or the like. Generally speaking, any material can be applied with the invention.

DE 195 41 996 describes a device for single feed application of solder pellets from a solder pellet reservoir with an applicator and a separate feeder, the separate feeder being designed as a circular conveyor. Through timed motion of the circular conveyor, solder pellets are conveyed from the reservoir to a capillary and by means of compressed air to the end of the capillary which at this point in time is close to a soldering point on the workpiece. The solder pellet is melted by laser energy and flows onto the soldering point.

The rapid and precise positioning of the capillary and the rapid precisely timed feed of solder pellets to the end of the capillary are essential prerequisites for an effective and rapid operation of the device. With the known device, the points where the solder pellets are to be places are approached individually in sequence. This is naturally time-consuming and thus not suitable for series production.

The object of the invention is to improve the known device so that it operates faster and is thus also suitable for series production.

The object is achieved by a device for applying pieces of material to a workpiece with a conveyor which conveys the pieces of material individually from a filling station to a processing station, which has a number of capillaries arranged with respect to each other in a preset pattern, in that the conveyor at the filling station conveys an equal number of pieces of material individually and to the capillaries, and in that an extraction station is arranged in the conveyance path from the filling station to the processing station and selectively extracts individual pieces of material from the conveyor. The extraction station has a suction station. Solder pellets taken at the extraction station are returned to the filling station through a return unit. The capillaries may be arranged along a straight line, in a pattern corresponding to a two-dimensional grid, or in a three-dimensional grid which is achieved by different lengths of the capillaries. The pieces of material are meltable or solderable material selected from the group consisting of gold, copper, tin, glass or plastic which are in solid or liquid form, or pieces of ceramic.

The basic principle of the invention consists in arranging a number of capillaries on a single circular conveyor. For mass production purposes, the capillaries are preferably arranged in the pattern of the soldering points. A plurality of soldering points can then be set in a single cycle. A more universally applicable device will be obtained by orienting the capillaries along a line and providing means that will ensure that only selected capillaries will receive solder pellets. Each capillary can be individually controlled with respect to the soldering process which is effected either in that each capillary is assigned its own laser or in that a laser is directed by a beam guide sequentially to the selected capillaries.

The individual capillaries are arranged in a grid which is commonly used in series production so that an entire line of soldering point can be set with one cycle.

The invention is explained in more detail with an example embodiment and referring to the drawing in which.

Figure 1:
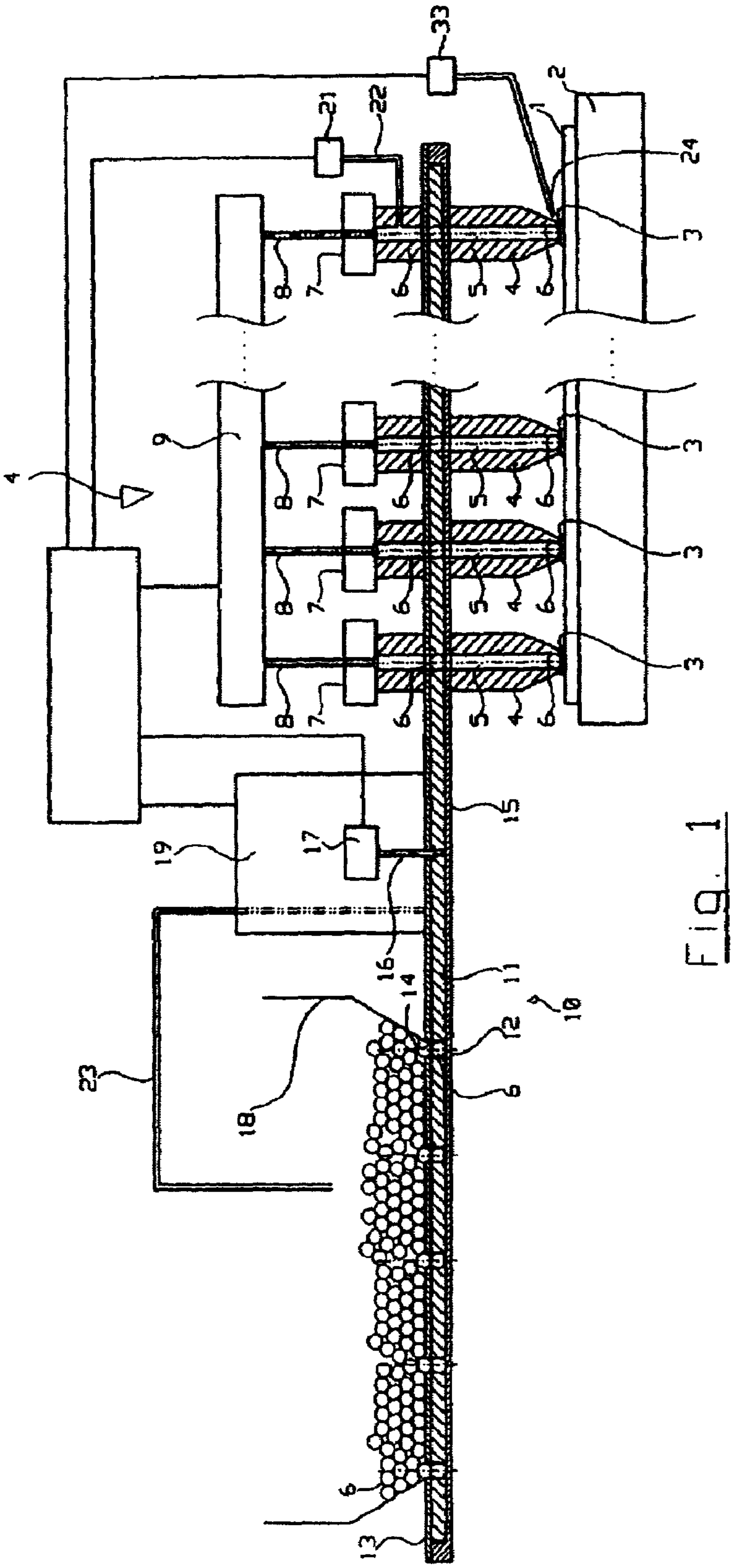
FIG. 1 is a schematic cross-section of the invented device.

Seen in FIG. 1 is a workpiece 1 clamped to a machine table 2. A plurality of soldering points 3 are on the workpiece 1. It is assumed here that all soldering points 3 lie in a constant grid along a line. The device has a plurality of capillaries 4 having a bore hole 5 through which one each solder pellet is conveyed to an assigned soldering point 3 and melted there by a laser beam. The laser beam is supplied here through a fiber optical wave guide 8 and an optical device 7 of a laser device 9. Each capillary can have its own assigned laser 9. It is also possible, however, to provide a single laser source and then to conduct the beams to the individual capillaries through a beam guide such as a "beam splitter".

Figure 2:
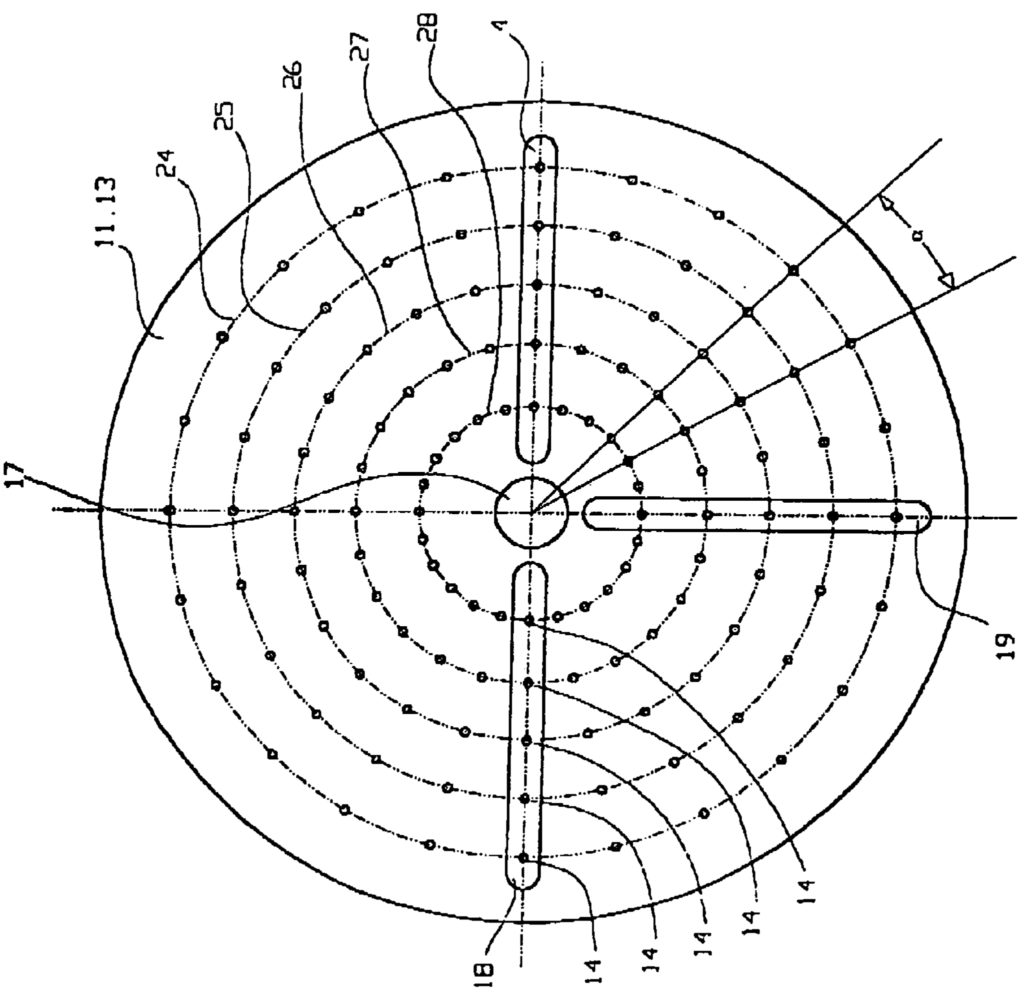
FIG. 2 is a schematic plan view of the invented device.

The feed of solder pellets 6 to the individual capillaries 4 takes place in cycles through a circular conveyor 10 which has a circular disc 11 with a plurality of holes 12 arranged in concentric circles on a center beam, the interval of the concentric circles 24 to 28 in FIG. 2 corresponding to the grid, that is, the interval between each of the individual capillaries.

The circular disc 11 pivots between two discs 13 and 15 and can be rotated through a shaft 16 and a motor 17. In the area of a filling station, the upper disc 13 also has a plurality of holes 14 which are oriented with the holes 12 so that precisely one solder pellet 6 falls out of the filling station 18 through the holes 14 and into the holes 12 of the rotating circular disc 12 and can be transported away from there in the direction of rotation. The circular disc 11 is rotated over a preset angular distance per working cycle. This causes the solder pellets 6 stored intermediately in the rotating circular disc 11 to be conveyed then to the capillaries 4 where they fall through holes in the lower disc 15 and through the bore hole 5 to the tip of the capillary and there onto the corresponding soldering point 3. The latter motion can be supported by compressed air conducted by a compressed air generator 21 through a pipeline in a section above the top circular disc 13. Naturally, a protective gas can also be used instead of compressed air. For the sake of clarity, only a compressed air generator 21 is shown in FIG. 1. Of course, each capillary has a connection 22 to the compressed air generator.

A protective gas may be delivered by a compressed gas source (33) which feeds inert gas to the processing station (4') through a nozzle (34) which is independent of the capillary.

It can be seen from what is described thus far that the device can convey any plurality of solder pellets per working cycle to a corresponding number of soldering points.

For an individual application in industrial scale manufacture, it will be suitable to orient the capillaries from the outset as the individual soldering points are arranged on the workpiece. However, the device will have more universal application if the capillaries are arranged in the grid and can be supplied individually with solder pellets and individually controlled. According to the invention, this is effected by an extraction station 19 arranged in the transport path between the filling station 18 and the soldering station 4'. The solder pellet 6 in the given opening 12 can be extracted and conveyed as necessary back into the filling station as indicated by the pipe 23 selectively through individual tracks or circuits 24, 25, 26, 27 or 28. Thus, individual capillaries can be selectively supplied with no solder pellet and the capillary is rendered ineffective for a soldering operation in which the other capillaries are active.

All operations are controlled by a central control unit, i.e., the rotation in a cycle of the circular conveyor 10, the selective extraction of individual solder pellets at the extraction station 19, the activation of the compressed air generator 21 and the activation of the laser.

In the example embodiment of FIG. 2, a large number of holes 12 and 14 are provided in the discs 11 and 13. The circular disc 11 is then rotated only over the angle alpha per working cycle. Of course, the condition for this is that the corresponding solder pellet is extracted over a corresponding number of cycles at the extraction station 19 before the corresponding hole has reached soldering station 4'. Naturally, it is also possible to provide a lesser number of holes which then entails a longer rotating motion per cycle.

What is claimed is:

1. Device for applying pieces of material to a workpiece with a conveyor which conveys the pieces of material individually from a filling station to a processing station (4') which has a number of capillaries (4) arranged with respect to each other in a preset pattern in that the conveyor (10) at the filling station (18) conveys pieces of material (6) to the capillaries (4) and in that an extraction station (19) is arranged in the conveyance path from the filling station (18) to the processing station (4') and selectively extracts individual pieces of material from the conveyor, characterized in that the extraction station has a suction station.

2. Device for applying pieces of material to a workpiece with a conveyor which conveys the pieces of material individually from a filling station to a processing station (4') which has a number of capillaries (4) arranged with respect to each other in a preset pattern, in that the conveyor (10) at the filling station (18) conveys pieces of material (6) to the capillaries (4) and in that an extraction station (19) is arranged in the conveyance path from the filling station (18) to the processing station (4') and selectively extracts individual pieces of material from the conveyor, characterized in that solder pellets (6) taken at the extraction station are returned to the filling station through a return unit (23).

3. Device for applying pieces of material to a workpiece with a conveyor which conveys the pieces of material individually from a filling station to a processing station (4') which has a number of capillaries (4) arranged with respect to each other in a preset pattern, in that the conveyor (10) at the filling station (18) conveys pieces of material (6) to the capillaries (4) and in that an extraction station (19) is arranged in the conveyance path from the filling station (18) to the processing station (4') and selectively extracts individual pieces of material from the conveyor, characterized in that the capillaries (4) are arranged along a straight line.

4. Device for applying pieces of material to a workpiece with a conveyor which conveys the pieces of material individually from a filling station to a processing station (4') which has a number of capillaries (4) arranged with respect to each other in a preset pattern, in that the conveyor (10) at the filling station (18) conveys pieces of material (6) to the capillaries (4) and in that an extraction station (19) is arranged in the conveyance path from the filling station (18) to the processing station (4') and selectively extracts individual pieces of material from the conveyor, characterized in that the capillaries (4) are arranged in a pattern corresponding to a two-dimensional grid.

5. Device for applying pieces of material to a workpiece with a conveyor which conveys the pieces of material individually from a filling station to a processing station (4') which has a number of capillaries (4) arranged with respect to each other in a preset pattern, in that the conveyor (10) at the filling station (18) conveys pieces of material (6) to the capillaries (4) and in that an extraction station (19) is arranged in the conveyance path from the filling station (18) to the processing station (4') and selectively extracts individual pieces of material from the conveyor, characterized in that the capillaries (4) are arranged in a three-dimensional grid which is achieved by different lengths of the capillaries.

6. Device as described in claim 4, characterized in that the capillaries (4) are arranged at a constant interval away from each other, this interval corresponding to a grid of soldering points (3) on a workpiece (1).

7. Device as described in claim 1, characterized by an associated optical or pneumatic detector device (9) which detects the absence/presence of pieces of material in the capillary (4).

8. Device as described in claim 1, characterized in that each capillary (4) has an associated laser (9) or an optical system (8) coupled with a laser.

9. Device as described in claim 1, characterized by a compressed gas source (21) and a pipeline (22) which feeds inert gas to the capillaries (4).

10. Device as described in claim 1, characterized by a compressed gas source (33) which feeds inert gas to the processing station (4') through a nozzle (34) which is independent of the capillary.

11. Device as described in claim 5, characterized in that the capillaries (4) are arranged at a constant interval away from each other, this interval corresponding to a grid of soldering points (3) on a workpiece (1).

12. Device as described in claim 2, characterized by an associated optical or pneumatic detector device (9) which detects the absence/presence of pieces of material in the capillary (4).

13. Device as described in claim 2, characterized in that each capillary (4) has an associated laser (9) or an optical system (8) coupled with a laser.

14. Device as described in claim 2, characterized by a compressed gas source (21) and a pipeline (22) which feeds inert gas to the capillaries (4).

15. Device as described in claim 2, characterized by a compressed gas source (33) which feeds inert gas to the processing station (4') through a nozzle (34) which is independent of the capillary.

16. Device as described in claim 4, characterized by an associated optical or pneumatic detector device (9) which detects the absence/presence of pieces of material in the capillary (4).

17. Device as described in claim 4, characterized in that each capillary (4) has an associated laser (9) or an optical system (8) coupled with a laser.

18. Device as described in claim 4, characterized by a compressed gas source (21) and a pipeline (22) which feeds inert gas to the capillaries (4).

19. Device as described in claim 4, characterized by a compressed gas source (33) which feeds inert gas to the processing station (4') through a nozzle (34) which is independent of the capillary.

* * * * *